(12) United States Patent
Telecco et al.

(10) Patent No.: US 7,317,630 B2
(45) Date of Patent: Jan. 8, 2008

(54) NONVOLATILE SEMICONDUCTOR MEMORY APPARATUS

(75) Inventors: Nicola Telecco, San Jose, CA (US); Vijay P. Adusumilli, San Jose, CA (US); Anil Gupta, Saratoga, CA (US); Edward Hui, Cupertino, CA (US); Steven J. Schumann, Sunnyvale, CA (US)

(73) Assignee: Atmel Corporation, San Jose, CA (US)

( * ) Notice: Subject to any disclaimer, the term of this patent is extended or adjusted under 35 U.S.C. 154(b) by 125 days.

(21) Appl. No.: 11/182,374

(22) Filed: Jul. 15, 2005

(65) Prior Publication Data

US 2007/0014140 A1 Jan. 18, 2007

(51) Int. Cl.
*G11C 5/06* (2006.01)

(52) U.S. Cl. .................................... 365/63; 365/189.01

(58) Field of Classification Search ................... 365/63
See application file for complete search history.

(56) References Cited

U.S. PATENT DOCUMENTS

| 4,731,737 | A | | 3/1988 | Witt et al. ................. 364/200 |
|---|---|---|---|---|
| 5,003,465 | A | | 3/1991 | Chisholm et al. .......... 364/200 |
| 5,621,685 | A | * | 4/1997 | Cernea et al. ......... 365/185.18 |
| 5,642,323 | A | * | 6/1997 | Kotani et al. .......... 365/230.03 |
| 5,838,603 | A | * | 11/1998 | Mori et al. ................... 365/63 |
| 6,205,082 | B1 | * | 3/2001 | Tomita et al. ............. 365/233 |
| 6,434,044 | B1 | * | 8/2002 | Gongwer et al. ...... 365/185.18 |
| 6,567,335 | B1 | | 5/2003 | Norman et al. ........ 365/230.06 |
| 6,573,567 | B1 | * | 6/2003 | Nishizawa et al. ......... 257/358 |
| 6,577,535 | B2 | * | 6/2003 | Pasternak ............. 365/185.11 |
| 7,069,370 | B2 | * | 6/2006 | Sukegawa et al. .......... 710/305 |
| 7,114,659 | B2 | * | 10/2006 | Harari et al. ............... 235/492 |
| 2005/0027928 | A1 | * | 2/2005 | Avraham et al. ............ 711/103 |

* cited by examiner

*Primary Examiner*—Son L. Mai
(74) *Attorney, Agent, or Firm*—Schneck & Schneck; Thomas Schneck (57) ABSTRACT

A nonvolatile memory apparatus includes a separate controller circuit and memory circuit. The controller circuit is fabricated on a first integrated circuit chip. The controller circuit includes a plurality of charge pump circuits, a system interface logic circuit, a memory control logic circuit, and one or more analog circuits. The memory circuit is fabricated on a second integrated circuit chip and includes a column decoder, a row decoder, a control register, and a data register. A memory-controller interface area includes a first plurality of die bond pads on the first integrated circuit chip and a second plurality of die bond pads on the second integrated circuit chip such that the first and second integrated circuit chips may be die-bonded together. A single controller circuit may interface with a plurality of memory circuits, thus further reducing overall costs as each memory circuit does not require a dedicated controller circuit.

16 Claims, 5 Drawing Sheets

NONVOLATILE SEMICONDUCTOR MEMORY APPARATUS

TECHNICAL FIELD

The present invention relates to nonvolatile memory circuits. More specifically, the invention relates to multi-component memory integrated circuits.

BACKGROUND ART

An increasing demand for portable digital storage media for equipment such as digital cameras, handheld gaming consoles, and audio players has created a need for high-density nonvolatile memories. For such applications, flash memory technology has been successfully developed and employed.

As density and read/program bandwidth requirements continue to increase, flash memories are becoming inherently more complex, both from a design and manufacturing standpoint. A basic requirement for a flash process is a set of high voltage rules and associated masks that define the memory cell array, surrounded by its row and column decoding circuits. Triple well processes are commonly used and gate oxide thicknesses ranging from 180 Å to 300 Å are typically required for the flash cell and high voltage selectors. In addition to the matrix of cells and decoders, the memory control and the system interface logic must be integrated. This integration requires specific gate oxides, typically ranging from 40 Å to 90 Å, for low voltage CMOS devices.

Figure 1:
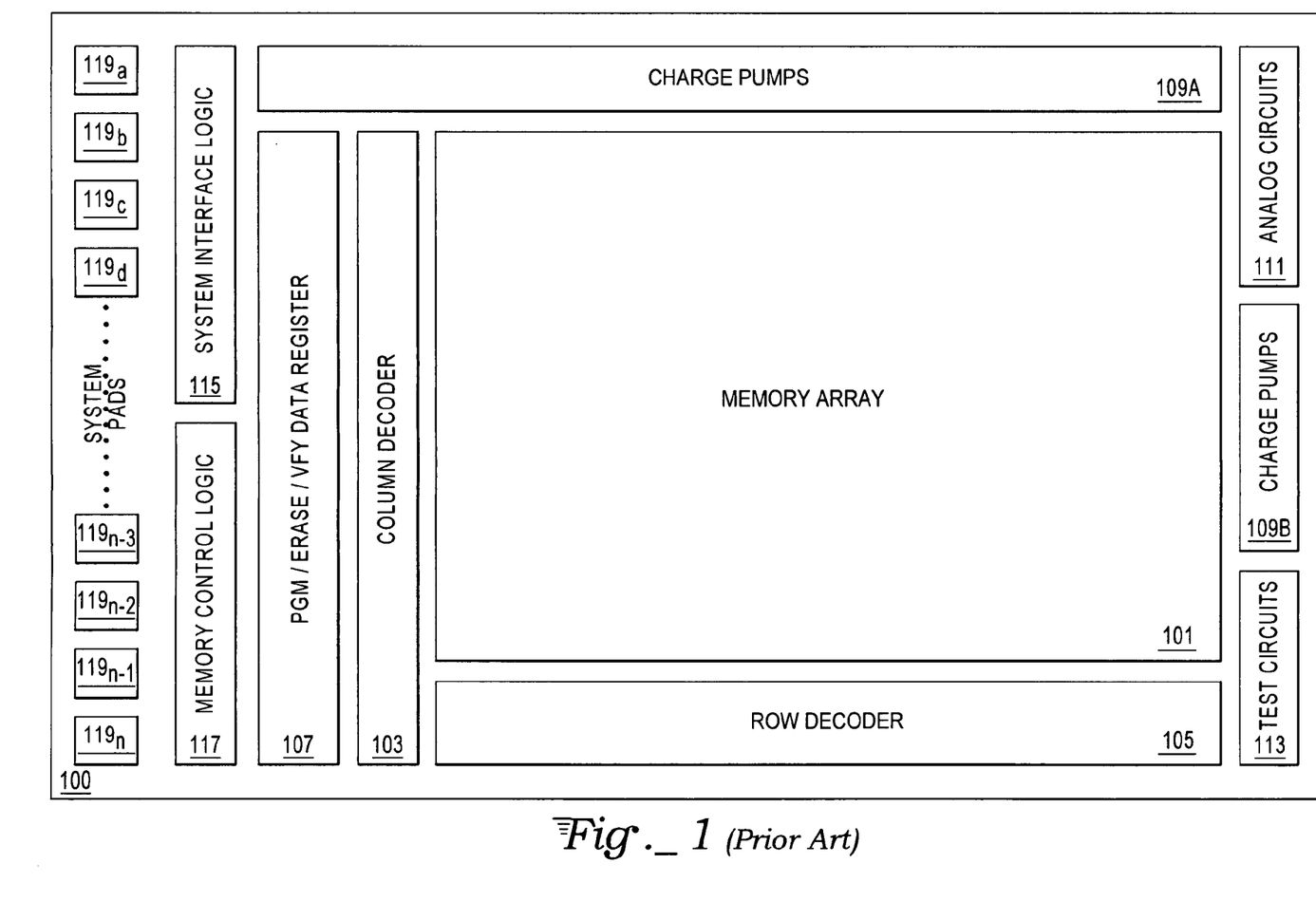
FIG. 1 is a monolithic memory integrated circuit of the prior art.

With reference to FIG. 1, a typical monolithic memory device 100 includes a memory array 101 containing a plurality of memory cells (not shown), and an associated column decoder 103 and row decoder 105 for addressing specific locations of memory. One or more banks of charge pumps 109A, 109B provide a high voltage needed for programming of cells in the memory array 101. A PGM/ERASE/VFY data register 107 provides buffering capabilities for data to be stored in the memory array 101, and a memory control logic circuit 117 and a system interface logic circuit 115 allow for control of the memory device 100 and interfacing the memory device 100 with external circuitry and microcontrollers (not shown). External devices interface with the memory device 100 through a plurality of system pads $119_a$, $119_b$, . . . $119_n$. Additional analog circuits 111 and test circuits 113 are frequently included on contemporary memory devices 100 as well.

Components such as the analog circuits 111, the charge pumps 109A, 109B, voltage and current references, buffers, voltage comparators, and regulators (not shown), that are also commonly found as fundamental building blocks of flash memories, generally require specifically tuned components as well. For example, low threshold voltage, $V_{th}$, devices (or native devices), resistors, capacitors, and even integrated inductors frequently need to be specifically fabricated. Hence, as the lithography advances to produce smaller and consequently more cost effective devices, such integration requires a commensurate increase in the number of advanced masks and processing steps. This increased complexity results in increased manufacturing costs and limits an economic scalability of future memory devices.

Therefore, what is needed is a way to separate out the complex and dissimilar circuits from those which are more readily fabricated while minimizing the impact on speed, throughput, or reliability of the circuit device.

SUMMARY OF THE INVENTION

A nonvolatile memory apparatus where high level functions of "storage," "retrieval," and "control" are separated and implemented in two or more separate semiconductor subsystems (for example, fabricating memory storage functions independently from memory control functions). A simple device, memory for example, could be fabricated in one layer and more complex devices (e.g., control and high voltage circuits) could be fabricated in another layer. Therefore, ubiquitous monolithic nonvolatile memory device of contemporary manufacture is implemented in a more cost efficient way with overall higher manufacturing yield. The higher efficiency does not come, however, at the detriment of memory performance, as each subsystem of the present invention is fabricated with a process most suitable for a specific circuit.

For an integrated circuit chip incorporating the memory array and related circuitry (i.e., a memory circuit), a high voltage CMOS flash technology is employed. Components of the memory circuit include a memory array (incorporating the high voltage CMOS memory cells), and memory select/address/retrieval circuits (i.e., a column and row decoder), to implement primary storage functions of the memory circuit. The memory select/address/retrieval circuits using high voltage CMOS transistors are relatively large, with respect to advanced high speed CMOS logic, but do not require extra or complex masks or steps. High performance of the memory storage and retrieval functions is achieved by optimizing internal memory architecture, page size, and the dedicated inter-chip interface design as discussed infra.

For an integrated circuit chip incorporated control function (e.g., an integrator/companion-control interface circuit), a relatively more expensive process is employed without requiring the complex lithographic, steps, and masks to be used on the memory circuit. Since the integrator/companion-control interface circuit area is much smaller than that of the memory circuit, an important cost saving per silicon wafer is achieved as many more integrator/companion-control interface circuits may be produced per wafer and enhanced yield is achieved.

In an exemplary embodiment, the nonvolatile memory apparatus thus includes a separate integrator/companion-control interface circuit and memory circuit. The integrator/companion-control interface circuit is fabricated on a first integrated circuit chip. The integrator/companion-control interface circuit includes a plurality of charge pump circuits, a system interface logic circuit, a memory control logic circuit, and one or more analog circuits. The memory circuit is fabricated on a second integrated circuit chip and includes a column decoder, a row decoder, a control register, and a data register. A memory-companion-control interface area includes a first plurality of die bond pads on the first integrated circuit chip and a second plurality of die bond pads on the second integrated circuit chip such that the two chip components may be die-bonded together. Additionally, a single integrator/companion-control interface circuit may interface with a plurality of memory circuits, thus further reducing overall costs on a per-memory basis, as each memory circuit does not require a dedicated integrator/companion-control interface circuit.

DETAILED DESCRIPTION OF THE INVENTION

Figure 2:
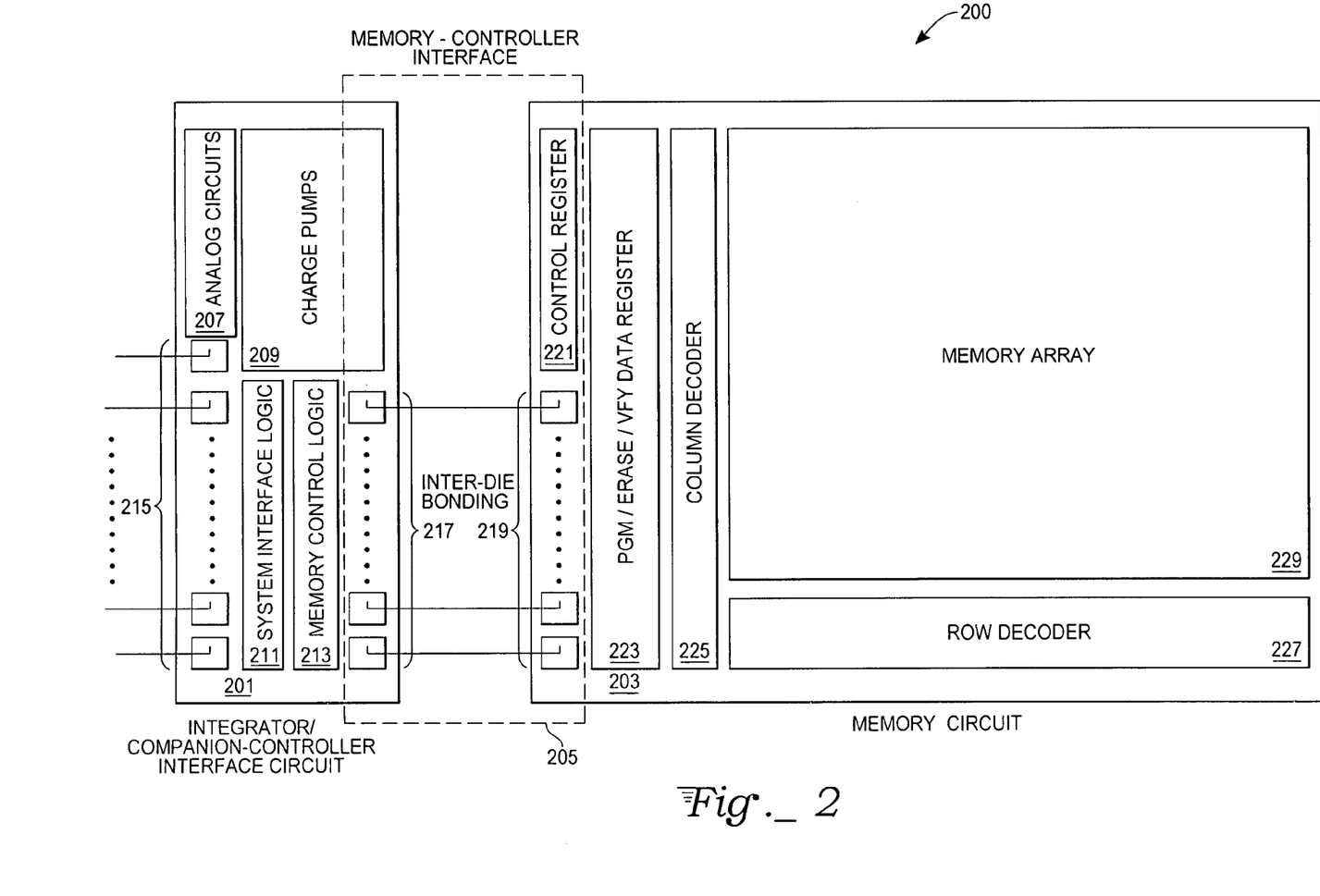
FIG. 2 is an exemplary nonvolatile memory apparatus including a memory controller chip and a flash memory chip of the present invention.

With reference to FIG. 2, an exemplary nonvolatile memory apparatus 200 includes an integrator/companion-control interface circuit 201, a memory circuit 203, and a memory-companion-control interface 205. Components of the integrator/companion-control interface circuit 201 include a plurality of analog circuits 207, a plurality of charge pumps 209, a system interface logic circuit 211, a memory interface logic circuit 213 and datapath logic to provide fast access for data passing to and from the memory circuit 203. The integrator/companion-control interface circuit 201 also includes a plurality of host system-controller interface pads 215, allowing bidirectional communications with one or more external host systems (not shown), and a plurality of integrator/companion-control interface circuit inter-die bonding pads 217, allowing bidirectional communications between the integrator/companion-control interface circuit 201 and the memory circuit 203 through a plurality of memory circuit inter-die bonding pads 219. Additional components of the memory circuit 203 include a control register 221, a PGM/ERASE/VFY data register 223, a column decoder 225, a row decoder 227, and a memory array 229.

The integrator/companion-control interface circuit 201 may be implemented on a single integrated circuit (IC). In addition to the integrator/companion-control interface circuit 201 providing an external host system interface through the host system-controller interface pads 215, the integrator/companion-control interface circuit 201, in this embodiment, integrates functions that are not directly required for storing data (e.g., the memory array 229 and the decoders 225,227). These functions include, for example, high voltage generation from the charge pumps 209, high voltage management through the plurality of analog circuits 207, decoding host commands through the system interface 211, and routing/addressing/programming commands through the memory control logic 213. These functions and others of the integrator/companion-control interface circuit 201 can be integrated into a single IC chip that is significantly smaller and less complex than an IC chip containing the memory circuit 203. Therefore, the memory circuit may be fabricated using a simpler process with fewer masks and manufacturing steps. As a result, fabrication yield of the memory circuit 203 can be increased significantly; consequently, reducing overall fabrication costs. That is, if the monolithic memory circuit 100 of the prior art (FIG. 1) suffers from fatal defect effected during fabrication of a complex part of, for example, the memory control logic 117, the entire memory circuit 100 needs to be scrapped (or, in a best case, reworked if possible). In either case, an overall production cost of a final memory chip may increase drastically. However, with the present invention, only the integrator/companion-control interface circuit 201 is fabricated utilizing the more intensive and demanding processes. Further, the integrator/companion-control interface circuit 201 can be used to control a plurality of memory circuits 203. This latter feature is discussed in more detail, infra.

Figure 3:
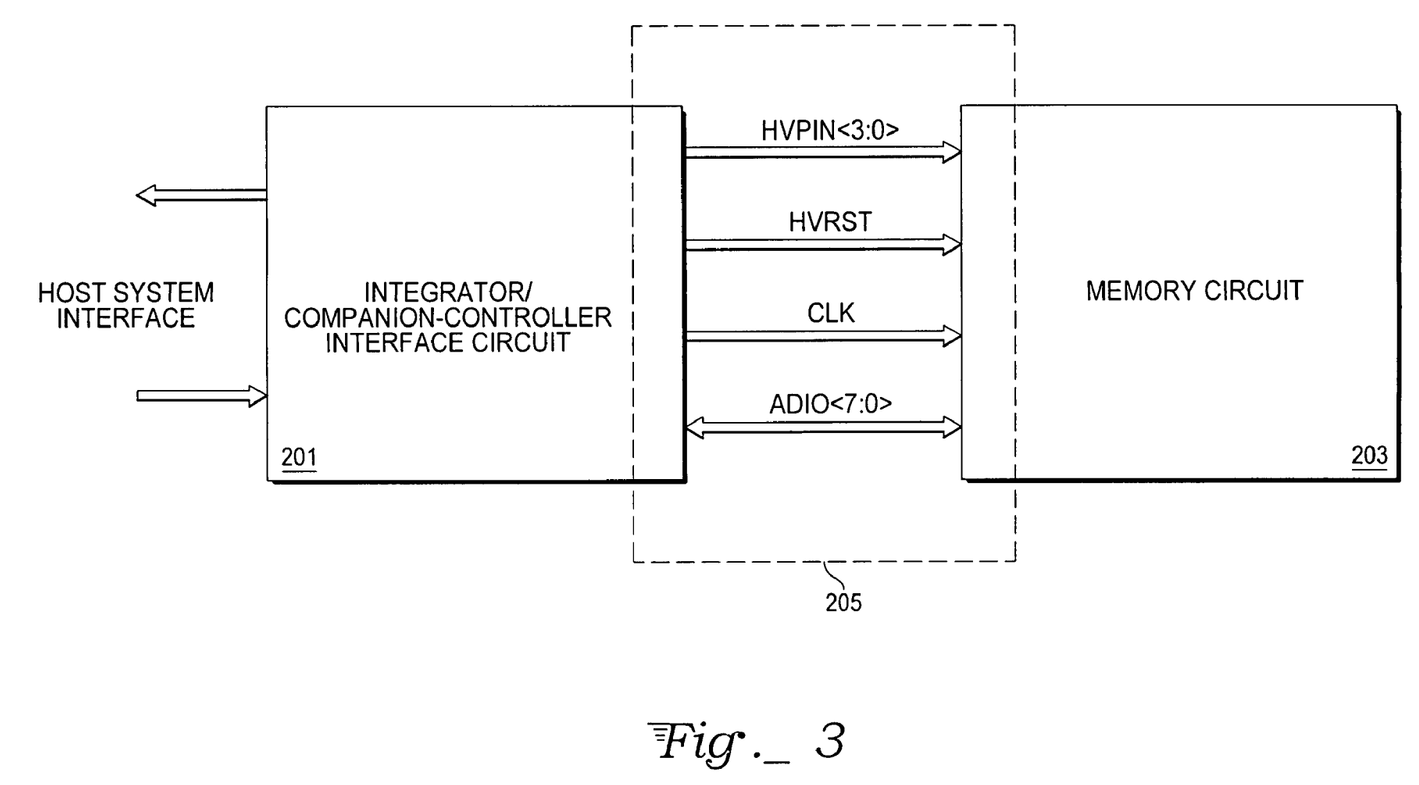
FIG. 3 is an exemplary dedicated memory-controller interface for the memory apparatus of FIG. 2.

With reference to FIG. 3, a specific exemplary embodiment of the memory-controller interface 205 utilizes four high voltage pins (HVPIN <3:0>) to control the memory array 229 within the memory circuit 203, one high voltage trip reset pin (HVRST), one internal clock pin (CLK), and eight multiplexed address/data-input/output pins (ADIO <7:0>), producing a total of ten logic pins, four high voltage pins, and two power pins (not shown). Up to four additional pins (not shown) allow the integrator/companion-control interface circuit 201 to address a plurality of memory circuits 203. For example, the use of two pins for ID <1:0> allows up to four memory circuits 203 to be addressed by a single integrator/companion-control interface circuit 201. A skilled artisan will realize that a larger number of memory circuits 203 can be directly addressed by utilizing an increased number of ID pins. Table 1 describes details for interface pins used in this embodiment.

The embodiment of FIG. 3 utilizes one high voltage trip reset pin HVRST for reset. Use of a single pin maintains pin count as low as possible, thereby increasing system efficiency and utilization. Reset typically happens infrequently during an operation sequence; the high voltage to perform a reset can be easily generated by the high voltage circuit consisting of the charge pumps 209 existing inside the integrator/companion-control interface circuit 201. The high voltage trip reset pin HVRST provides a dual mode capability. CMOS levels are defined as $0 \leq V_{CMOS} \leq 3.3$ V. HVRST is a reset pin at voltages greater than CMOS levels and command mode pin if voltages are within CMOS levels. A reset of the memory circuit 203 initializes the internal registers (i.e., the control register 221 and the PGM/EPASE/VFY data register 223) and resets any state machines (not shown) if needed. The integrator/companion-control interface circuit 201, which also acts as a global supervisor for the memory circuit 203, asserts the reset. Based on the command, a data direction of the ADJO pins, which depends on a particular mode of the memory circuit 203, is directed by the integrator/companion-control interface circuit 201 during a mode setting process.

After the reset, an actual command is initiated by asserting the mode signal and then sending in a byte on the ADIO <7:0> once every CLK cycle. During this mode, the ADIO pins of the memory-controller interface 205 are interpreted as input only pins. Based on the input command, the direction of the ADIO pins is changed accordingly.

TABLE 1

| Interface Pin | Logic Name | Type | Comment |
| --- | --- | --- | --- |
| GND | GND | Input | All flash GND pads - short connected |
| VDD | VDD | Input | All flash VCC pads - short connected |
| HVPIN <3:0> | Hvpin <3:0> | Input | High voltage pins |

TABLE 1-continued

| Interface Pin | Logic Name | Type | Comment |
| --- | --- | --- | --- |
| HVRST | HV rst trip and ctrl | Input | This pin allows for command to be serially sent in, RSTN is generated by Hvtrip |
| CLK | Mem_clk | Input | Clock pin for synchronizing data Xfer |
| ADIO <7:0> | Adio[7:0] | In/Out | Multiplexed address/data/control pins |
| ID <3:0> | ID <3:0> | Input | ID pins are no-bond pins with a tie-hi/lo |

The ADIO pins are all, by default, set in an input mode unless the mode control changes. By dealing with directionality of the ADIO pins in this way, the need of an Output Enable (OE) pin is obviated, thus making the interface simpler. The direction of the ADIO is fixed until a new command is asserted.

Figure 4:
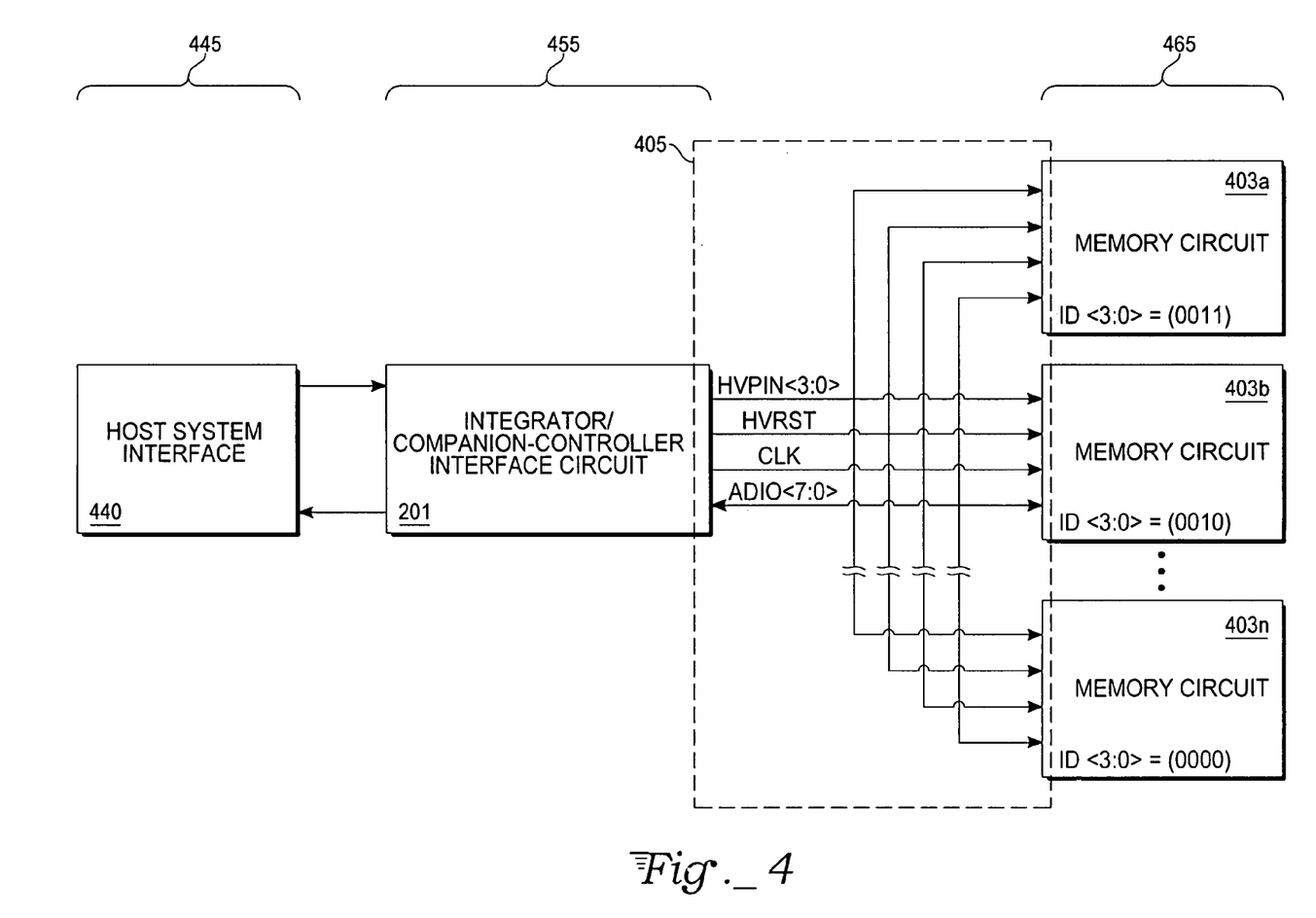
FIG. 4 is an exemplary dedicated memory-controller interface for a plurality of memory apparatuses.

With reference to FIG. 4, an additional exemplary embodiment of the memory-controller interface 405 incorporates the integrator/companion-control interface circuit 201 with a plurality of memory circuits 403a, 403b, . . . , 403n. Generally, the integrator/companion-control interface circuit 201 works as described supra and in FIGS. 2 and 3. Four high-voltage pins (HVPIN <3:0>), the high-voltage trip reset pin (HVRST), the internal clock pin (CLK), and eight multiplexed address/data-input/output pins (ADIO <7:0>) connect in parallel to the plurality of memory circuits 403a, 403b, . . . , 403n and work as explained supra. In addition, the up to four additional ID pins (ID<3:0>), of this exemplary embodiment, are an additional set of pins allowing the companion-control interface circuit 201 to control multiple chips. ID <3:0> pins are either tied-off to a high or low logic level (represented by 1 or 0 respectively). A combination of ID <3:0> pin tie-offs and a command with an embedded ID from the companion-control interface circuit 201 allow a memory chip with an ID corresponding to the one in the command to be woken up and all remaining memory chips idled.

For instance, if four memory chips are controlled by the companion-control interface circuit 201, the memory chips would each have their least significant ID pins, ID <1:0> pins, tied-off to logic levels (11), (10), (01), and (00) respectively, with ID <3:2> pins all tied-off to 0. The command with the embedded ID is received and interpreted by the respective state machine inside each of the four memory chips. The embedded ID is checked in each memory chip against the ID <1:0> pin tie-offs of the chip. If the embedded ID received does not match the ID <1:0> tie-offs, the memory chip is idled. If the embedded ID received matches the ID <1:0> tie-offs, the memory chip is activated. Therefore, with each memory chip containing a unique ID <3:0> tie-off, only one memory chip is activated at any time, while all others memory chips in the system are idled. Circuitry inside the memory chip enables only one chip to receive signals on the digital and high voltage pins. Inactive memory chips are disabled and their ability to receive signals is shut-off. The inactive memory chips are activated only when an Id-tag active command is received. The high voltage lines are bypassed.

Each level of a system incorporating the memory-controller interface 405 may be implemented in a different semiconductor fabrication process. A first fabrication process 445 may be used to implement a host system interface 440 in an ASIC CMOS process, for example. A second fabrication process 455 may be used to implement the integrator/companion-control interface circuit 201 in, for example, a high voltage CMOS process. A third fabrication process 465 may be used to implement the plurality of memory circuits 403a, 403b, . . . , 403n in a high voltage memory process in an exemplary embodiment. The inter-die bonding pads (not shown), discussed supra, are used for attaching bonding wires to effect connections between dice implemented in the various fabrication processes.

Since the complex memory ERASE, PROGRAM and VERIFY algorithms are executed by control logic in the integrator/companion-control interface logic 201, the memory circuit 203 (FIG. 2) requires only decoding logic to interpret the issued commands, and uses simple decoding circuitry and buffers to route its internal signals.

Figure 5:
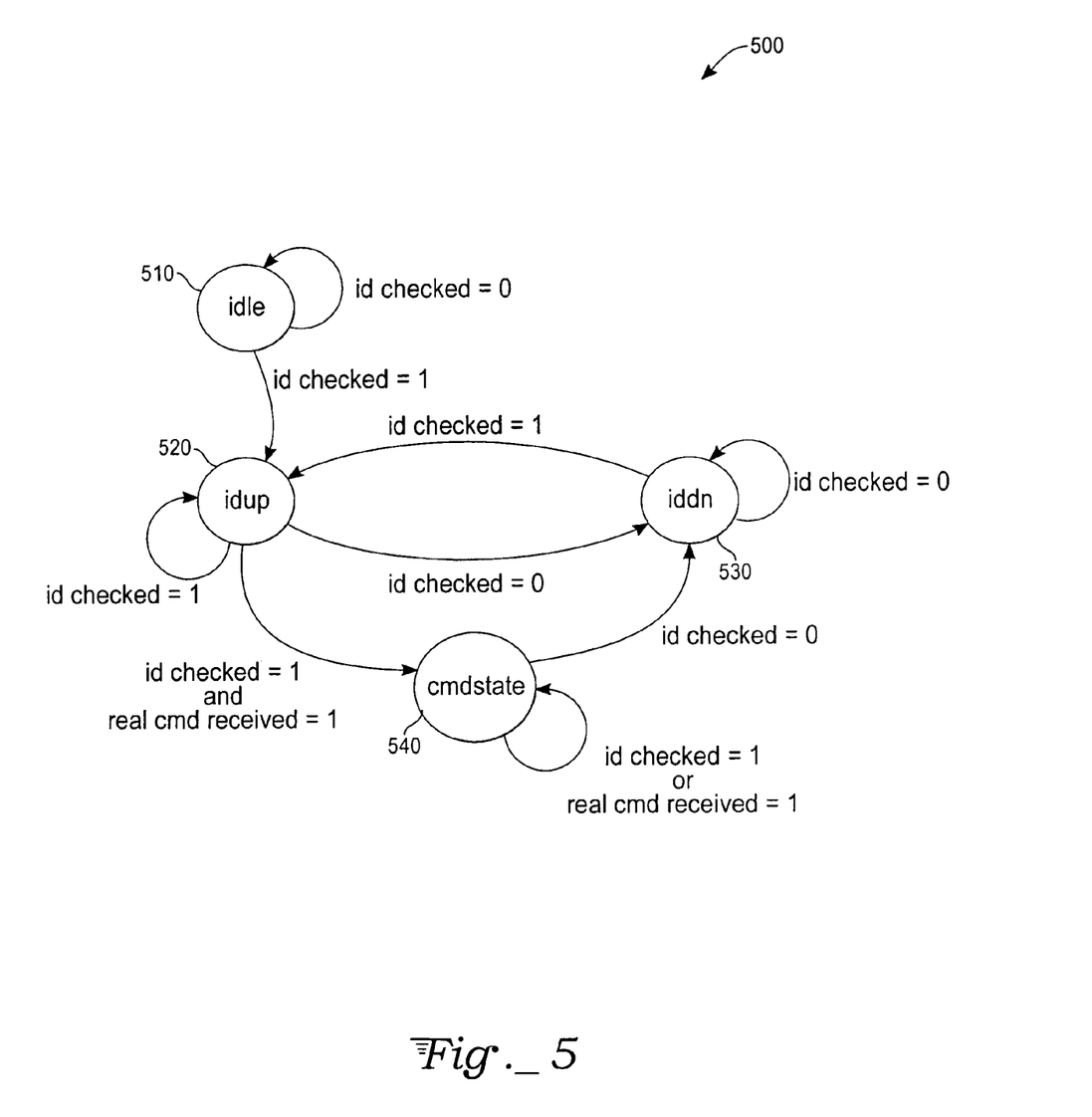
FIG. 5 is an exemplary command state diagram for the memory apparatus of FIG. 2.

With reference to FIG. 5, an exemplary command state diagram 500, command interpretation by the memory circuit 203 (FIG. 2) decoding logic commences in an idle state 510. The state-machine starts in the idle state 510 on a reset of the system or at power-up. If an id is not checked (id checked=0), the idle state 510 is maintained. Upon completion of an id check (id checked=1), a state transition occurs from the idle state 510 to an idup state 520. The idup state 520 signifies that the device is ready for a real command. If an ID is checked (ID checked equals 1) the device remains in the idup state 520. From the idup state 520 a state transition is made to an iddn state 530 when the id is not checked (id checked=0). The iddn state 530 is a condition where the device is not ready for a command. In the iddn state 530 all commands are ignored although the device is still listening. A state transition to the idup state 520 is taken from the iddn state 530 when the id check is done (id checked=1). When an id check is done (id checked=1) and a real command is received (real cmd received=1) a state transition from the idup state 520 to a cmdstate 540 is made. The cmdstate state 540 means that a valid command has been received by the device. From the cmdstate 540 if the id is not checked (id checked=0) or a real command is received (real cmd received equals 1) a state transition to the iddn state 530 is made. If the id check is done (id checked=1) from the cmdstate 540 the command state-machine remains in the cmdstate 540.

The controller command set is designed to guarantee a wide flexibility in operation control and timing of the memory circuit 203. Table 2, infra, lists an exemplary embodiment of various commands.

TABLE 2

| Control <7:0> | ADIO <7:0> | | Function | Comments |
|---|---|---|---|---|
| 8'b0000_0000 | | | Idle | Idle mode |
| 8'b0000_0001 | IO pads are configured as input | | InitMode | Device configuration settings are loaded into the latches |
| 8'b0010_0000 | — | | Read | Sets the global read signal; 1 cycle |
| 8'b0100_0000 | — | | Progm | Sets the global Program signal; 1 cycle |
| 8'b1000_0000 | — | | Erase | Sets the global Erase signal; 1 cycle |
| 8'b1001_0000 | — | | TstMode | Sets the global test mode signal; 1 cycle |
| 8'bLLLL_1000 | 3'b000-3'b111 Decode Control | Decode Signals | Mctrl | Micro control signals. The decoded signal are latched in Mctrl latches. The possible modes that have Mctrl are Read, Progm, Erase and TstMode and are reflected in the 4 MSBs of the control operation |
| 8'b0000_0111 | IO pads are configured as input | | DataIN | Data Input Mode done after program cmd and input address |
| 8'b0000_1011 | IO pads are configured as output mode | | DataOut | Data output mode after Read/Mctrl |
| 8'b0000_1111 | IO pads are configured as input | | AddIN | Input address in this mode is latched |
| 8'b0000_0101 | IO pads are configured as output | | Status | Status is read out in this mode, by serially shifting out a byte of status |
| 8'b1111_XXXX | ID Tag Detect-Active | | Chip ID | Determines the ID of the chip and activates the chip. By default the chip is deactivated, needs wake up |
| 8'b0111_XXXX | ID Tag Detect-Inactive | | Chip ID | Deactivation of the chip |

As briefly mentioned supra, the chip ID mode allows an extension of the amount of addressable memory. The chip ID mode is entered by use of two commands: ID Tag Detect-Active and ID Tag Detect-Inactive commands. Each of the memory chips (i.e., a plurality of the memory circuits 203) in the system is equipped with two bits of unique ID by having up to four pads connected to one of four possible combinations of $V_{DD}$ and $V_{SS}$. On a user command, the integrator/companion-control interface circuit 201 will broadcast an activate message with an appropriate command to wake up only one of the plurality of memory chips based on the user address. The integrator/companion-control interface circuit 201 embeds the chip address in the up to four least-significant-bits (LSBs) of the activate/deactivate commands. The memory chip on receipt of this command will compare the LSBs to that of the ID pads to determine if it will follow through with the subsequent user command. Once the memory chip is active, it will stay active until the ID Tag Detect-Inactive command deactivates it. One of skill in the art will recognize that a variety of other techniques for setting a specific signature for each memory chip could be employed. For example, the ID pins could be replaced, in another embodiment, by using programmable nonvolatile memory elements (fuses) within the memory chips themselves or, alternatively, by using metal options. For example, a skilled artisan could readily construct a system of prefabricated metal links connecting ID pins, where selected links are removed by laser etching to form a particular ID.

Test Latch mode ("TstMode") allows specific test modes to be executed, either by the integrator/companion-control interface circuit 201 or by an external tester (not shown) in a production environment. The nonvolatile memory apparatus 200 (FIG. 2) allows for independent testing of both the integrator/companion-control interface circuit 201 and the memory circuit 203, offering greater flexibility in the testing flow. Once in a global test mode, the ADIO signals are interpreted to load the test latches. Test latches can be combined with microcontroller commands to execute specific memory functions.

An Initialization mode ("InitMode") is executed by default on power-up. After the memory circuit 203 (or plurality of memory circuits 203 in a multi-chip configuration) has been reset, the integrator/companion-control interface circuit 201 initiates the loading of device configuration settings. Dedicated memory space within the memory circuit 203 is reserved for device configuration, specific chip identification codes, and additional microcode storage. The dedicated memory space is referred to as programmable fuse space. Device configuration setting may include, for example, enabling of specific user features, analog circuit trimmings, high voltage circuit configurations, and various timings, as may be needed for proper operation of the memory.

The microcode for functional and/or test mode execution by the integrator/companion-control interface circuit 201 is stored in a reserved memory space within the memory array 229 (FIG. 2) itself, to allow for easy changes and upgrades. A portion of code permanently stored in a read only memory (ROM, not shown) within the integrator/companion-control interface circuit 201 can thus be limited to contain a loader segment, while the remaining code is loaded from the memory into a controller SRAM block (not shown) during initialization. The flexibility offered by such implementation is highly advantageous and is readily recognizable to a skilled artisan.

Skilled artisans will further recognize that the present invention offers additional advantageous features over the existing art. For example, after manufacturing, the memory circuit 203 can be programmed by a tester to contain specific test code, for optimal test routing execution once the memory circuit 203 is bonded to the integrator/companion-control interface circuit 201. After testing, this specific code can optionally be removed and replaced with functional code, for in-system operation. Other possible uses include the ability to upgrade functional code, and/or add specific customer features. Although the present invention has been shown and described in terms of particular exemplary embodiments, a skilled artisan will recognize that further adaptations may be made to the invention while remaining within a scope of the present invention. For example, specific functional blocks within the integrator/companion-control interface circuit 201 and the memory circuit 203 may be located in alternative areas, depending on need. That is, for a particular device application (e.g., a digital camera), it may be advantageous to include the analog circuit block 207 along with each of a plurality of memory circuits 203. Alternatively, a skilled artisan will also recognize that, depending on the functional blocks chosen, the integrator/companion-control interface circuit 201 is analogous to system elements known simply as controllers. Therefore, various modifications are contemplated to be within the scope of the present invention.

What is claimed is:

1. A nonvolatile memory apparatus comprising:
a controller circuit fabricated on a first integrated circuit chip and including a plurality of charge pump circuits, a system interface logic circuit, and a memory control logic circuit;
a memory circuit fabricated on a second integrated circuit chip and including a memory array, a column decoder, and a row decoder; and
a memory-controller interface including a first plurality of die bond pads on the first integrated circuit chip and a second plurality of die bond pads on the second integrated circuit, the memory-controller interface being configured to allow electrical coupling through a plurality of pins corresponding to the first and second pluralities of die bond pads of the controller circuit and the memory circuit, the first and second die bond pads including a command mode pin and multiplexed address/data-input/output (ADIO) pins, the controller circuit configured to determine data direction of at least the ADIO pins depending on a mode of the memory circuit set in response to a command sent on the ADIO pins while the command mode pin is asserted.

2. The nonvolatile memory apparatus of claim 1 wherein the controller circuit further comprises one or more analog circuits.

3. The nonvolatile memory apparatus of claim 1 wherein the memory circuit further comprises a control register and a data register.

4. The nonvolatile memory apparatus of claim 1 wherein the memory-controller interface further comprises inter-die bonding, the inter-die bonding arranged so as to electrically couple certain ones of the first plurality of die-bond pads to certain ones of the second plurality of die bond pads.

5. The nonvolatile memory apparatus of claim 1 wherein the first plurality of die-bond pads further include one or more high voltage pins, a high voltage reset pin, and a clock pin.

6. The nonvolatile memory apparatus of claim 5 wherein the ADIO pins are configured to couple data to the memory circuit bidirectionally.

7. The nonvolatile memory apparatus of claim 1 wherein the second plurality of die-bond pads further include one or more high voltage pins, a high voltage reset pin, and a clock pin.

8. The nonvolatile memory apparatus of claim 7 wherein the ADIO pins are configured to couple data to the controller circuit bidirectionally.

9. A nonvolatile memory apparatus comprising:
a controller circuit fabricated on a first integrated circuit chip and including a plurality of charge pump circuits, a system interface logic circuit, a memory control logic circuit, and one or more analog circuits;
a memory circuit fabricated on a second integrated circuit chip and including a column decoder, a row decoder, a control register, and a data register; and
a memory-controller interface including a first plurality of die pond pads on the first integrated circuit chip and a second plurality of die pond pads on the second integrated circuit chip, the memory-controller interface being configured to allow electrical coupling through a plurality of pins corresponding to the first and second pluralities of die bond pads of the controller circuit and the memory circuit, the first and second die bond pads including a command mode pin and multiplexed address/data-input/output (ADIO) pins, the controller circuit configured to determine data direction of at least the ADIO pins depending on a mode of the memory circuit set in response to a command sent on the ADIO pins while the command mode pin is asserted.

10. The nonvolatile memory apparatus of claim 9 wherein the memory-controller interface further comprises inter-die bonding, the inter-die bonding arranged so as to electrically couple certain ones of the first plurality of die-bond pads to certain ones of the second plurality of die bond pads.

11. The nonvolatile memory apparatus of claim 9 wherein the first plurality of die-bond pads further include one or more high voltage pins, a high voltage reset pin, and a clock pin.

12. The nonvolatile memory apparatus of claim 11 wherein the ADIO pins are configured to couple data to the memory circuit bidirectionally.

13. The nonvolatile memory apparatus of claim 9 wherein the second plurality of die-bond pads further include one or more high voltage pins, a high voltage reset pin, and a clock pin.

14. The nonvolatile memory apparatus of claim 13 wherein the ADIO pins are configured to couple data to the controller circuit bidirectionally.

15. The nonvolatile memory apparatus of claim 1 further comprising a plurality of memory circuits fabricated on additional integrated circuit chips each memory circuit including a memory circuit, a column decoder, and a new decoder, each additional integrated circuit chip having a plurality of additional die bond pads including a command mode pin and multiplexed address/data-input/output (ADIO) pins, the additional die bond pads as well as the second plurality of die bond pads also including a set of ID pins establishing a distinct identification for each of the memory circuits, wherein only that one of the plurality of memory circuits matching an identification embedded with a command being activated, all other memory circuits not matching the identification embedded within that command being idle.

16. The nonvolatile memory apparatus of claim 9 further comprising a plurality of memory circuits fabricated on additional integrated circuit chips each memory circuit including a memory circuit, a column decoder, and a new decoder, each additional integrated circuit chip having a plurality of additional die bond pads including a command mode pin and multiplexed address/data-input/output (ADIO) pins, the additional die bond pads as well as the second plurality of die bond pads also including a set of ID pins establishing a distinct identification for each of the memory circuits, wherein only that one of the plurality of memory circuits matching an identification embedded with a command being activated, all other memory circuits not matching the identification embedded within that command being idle.

* * * * *